United States Patent [19]
Sandhu et al.

[11] Patent Number: 5,937,294
[45] Date of Patent: Aug. 10, 1999

[54] METHOD FOR MAKING A CONTAINER CAPACITOR WITH INCREASED SURFACE AREA

[75] Inventors: Gurtej Singh Sandhu; Randhir P.S. Thakur, both of Boise, Id.

[73] Assignee: Micron Technology, Inc., Boise, Id.

[21] Appl. No.: 08/884,371

[22] Filed: Jun. 27, 1997

Related U.S. Application Data

[63] Continuation of application No. 08/513,730, Aug. 11, 1995, abandoned.

[51] Int. Cl.$^6$ .................................................. H01L 21/8242
[52] U.S. Cl. ............................................. 438/255; 438/398
[58] Field of Search .................................. 438/255, 396, 438/398, 253

[56] References Cited

U.S. PATENT DOCUMENTS 5,438,011   8/1995   Blalock et al. .
5,556,802   9/1996   Bakeman, Jr. et al. ................ 438/396

FOREIGN PATENT DOCUMENTS 0279165   12/1989   Japan .

*Primary Examiner*—Tuan H. Nguyen
*Attorney, Agent, or Firm*—Reed Smith Shaw & McClay LLP

[57] ABSTRACT

A method of forming a polysilicon electrode having at least one roughened surface is performed by roughening a template layer to form a roughened template layer. A layer of polysilicon is next deposited on top of the roughened template layer. The polysilicon electrode is then formed by etching away the roughened template layer, and thereby exposing a roughened surface on the polysilicon electrode.

23 Claims, 6 Drawing Sheets

METHOD FOR MAKING A CONTAINER CAPACITOR WITH INCREASED SURFACE AREA

This is a continuation of application Ser. No. 08/513,730 filed on Aug. 11, 1995, now abandoned.

FIELD OF THE INVENTION

The present invention relates to integrated circuit structures and, more particularly, to capacitor structures used with dynamic random access memory ("DRAM") cells formed on semiconductor integrated circuits.

BACKGROUND

The miniaturization of electrical components and their integration on a single piece of semiconductor material has been the catalyst for a world wide information revolution. As integrated circuit technology has progressed, it has been possible to store increasing amounts of digital data in a smaller space at less expense and still access the data randomly, quickly and reliably. Central to this increased ability to store and retrieve data has been the dynamic random access memory, or DRAM fabricated as an integrated circuit.

In the case of mass produced DRAMs, the cost per bit of memory has historically decreased as the number of bits which can be reliably stored on each integrated circuit has increased. Thus, it is advantageous to pack as many bit-storing memory cells as possible on each square unit of planar surface area available on a semiconductor integrated circuit.

DRAMs are formed of a large number of storage nodes which require transistors and capacitors in order to store information. The state of the art of fabricating the storage nodes of DRAM circuits has progressed to the point where the transistors of the nodes can be made much smaller than the capacitors.

In order to function properly within the nodes, the capacitors must possess a minimum amount of capacitance. If a capacitor exhibits too little capacitance, it loses the charge placed upon it too rapidly, causing errors in data storage. Thus, it is essential that the electrodes of storage node capacitors be large enough to retain an adequate charge in spite of parasitic capacitances and noise that may be present during circuit operation. Generally, it is desirable that each memory cell capacitor have as much capacitance as possible, but at least $20 \times 10^{-15}$ farads, and preferably more than $60 \times 10^{-15}$ farads of charge storage capacity.

The capacitance value, C, of a capacitor is dependent upon the dielectric constant, $\epsilon$, of the material placed between the electrodes of the capacitor, the distance, d, between the electrodes, and the effective surface area, A, of the electrodes. The relationship may be expressed $C=A\epsilon/d$. In many cases the material used as the dielectric between the electrodes of the capacitor is limited to only a few possibilities. The thickness of the dielectric is limited by leakage current. Thus, the parameter which can most easily be varied to obtain increased storage capacity in DRAM capacitors is the surface area of the capacitor electrodes.

Therefore, it is a goal of DRAM designers to increase the surface area of capacitor electrodes as much as possible. It is also a goal to reduce the planar area occupied by each capacitor to a minimum so that as many memory cells as possible can be packed onto a single integrated circuit. Various three dimensional structures have been proposed and adopted in the art of DRAM fabrication to maintain the value of capacitors at a high level while keeping the planar area, or footprint, allocated to the capacitor at a minimum.

Among the proposed methods for maintaining cell capacitance while decreasing the planar area devoted to the cell capacitor is a "trench transistor cell" such as that described in Lu, "Advanced Structures for Dynamic RAMs", IEEE Circuits and Devices Magazine, pp. 27–35, (January 1989). In the trench transistor cell of the Lu paper, the capacitor cell is a vertical structure with an access transistor which is also vertica. The access transistor is placed above the cell capacitor. The described trench cell provides greater capacitor electrode area in a small planar area when compared to many planar capacitor structures. However, it provides only a modest increase in charge storage capacity, as well as additional difficulties during fabrication.

It is well known in the art that the storage capacitance of a node capacitor can be enhanced without increasing either the area required for the cell or the storage electrode height by "roughening" the silicon used to form a storage node electrode. In this method, a relatively flat silicon layer is subjected to surface migration and grain growth until the silicon layer forms into rounded clusters. An increase in capacitance results because the surface area of the rounded silicon clusters is greater than that of a relatively flat silicon layer. The process of roughening the silicon used to form a storage node electrode has been applied in the context of container capacitors to roughen both the inner and outer surfaces of the container capacitor. However, these known methods for roughening both the inner and outer electrode surfaces of a container capacitor electrode either require costly process steps, or result in capacitor electrode having a planar surface area that is undesirably large.

One known method for roughening both the inner and outer electrode surfaces of a container capacitor requires forming the container capacitor electrode from amorphous polysilicon, seeding the surfaces of the amorphous polysilicon electrode with a hydride such as, for example, $SiH_4$ or $Si_2H_6$, and annealing the seeded structure at approximately 700° C. and $10^{-8}$ torr for a period of about 20 seconds. Although the annealing step causes both the inner and outer surfaces of the container capacitor electrode to roughen, the temperature and pressure required for the annealing step render this process costly from a manufacturing standpoint and therefore undesirable.

Another known method for roughening both the inner and outer electrode surfaces of a container capacitor requires forming an internal container capacitor structure from smooth polysilicon, and then depositing a layer of rough polysilicon over top of the smooth polysilicon structure. In this method, the minimum thickness of the internal smooth polysilicon is believed to be about 500 angstroms, and the minimum thickness of the rough polysilicon lying on top of the smooth polysilicon is believed to be about 500 angstroms. Since the rough polysilicon is deposited on top of the smooth polysilicon both on the inner and outer surfaces of the container capacitor electrode, the minimum width of a container capacitor electrode formed in accordance with this method is believed to be approximately 1500 angstroms. Since it is a goal of DRAM designers to decrease the planar surface area occupied by each capacitor on an integrated circuit, it would be desirable to have a container capacitor electrode with roughened inner and outer surfaces having a thickness that is substantially less than 1500 angstroms.

It is therefore an object of the present invention to provide a container capacitor structure for use on an integrated circuit, wherein both the inner and outer surfaces of the container capacitor electrode are roughed.

It is a further object of the present invention to provide a container capacitor structure for use on an integrated circuit, wherein the thickness between the inner and outer surfaces of the container capacitor electrode is substantially less than 1500 angstroms.

It is a still further object of the present invention to provide a method for forming a container capacitor structure for use on an integrated circuit, wherein the step of annealing the capacitor structure at a high temperature is not required to form the capacitor structure.

It is another object of the present invention to provide an integrated circuit capacitor structure and method for forming such an integrated circuit capacitor structure which can be reliably manufactured and operated.

It is another object of the present invention to provide an integrated circuit capacitor structure and a method for forming such an integrated circuit capacitor structure which is particularly adapted for integration into DRAM integrated circuits.

These and other objects and advantages of the invention will become more fully apparent from the description and claims which follow or may be learned by the practice of the invention.

SUMMARY OF THE INVENTION

The present invention is directed to a method for forming an electrode having roughened inner and outer surfaces for use on an integrated circuit. Initially, a template layer is formed. Next, the template layer is roughened to form a roughened template layer. A layer of polysilicon is then deposited on top of the roughened template layer. The electrode with roughened inner and outer surfaces is then exposed by removing at least a portion of the roughened template layer.

In accordance with a further aspect, the present invention is directed to a capacitor electrode for use on an integrated circuit. The capacitor electrode is formed of a layer of polysilicon having first and second opposing surfaces separated by a thickness of between 250 and 1000 angstroms. Both of the first and second opposing surfaces have a roughened outer texture.

In accordance with a still further aspect, the present invention is directed to a method of forming a polysilicon electrode having at least one roughened surface. Initially, a template layer is roughened to form a roughened template layer. A layer of polysilicon is next deposited on top of the roughened template layer. The polysilicon electrode is then formed by etching away the roughened template layer, and thereby exposing a roughened surface on the polysilicon electrode.

BRIEF DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof will be described and explained with additional specificity and detail through the use of the accompanying drawings.

DETAILED DESCRIPTION OF THE PREFERRED EMBODIMENT

Figure 1:
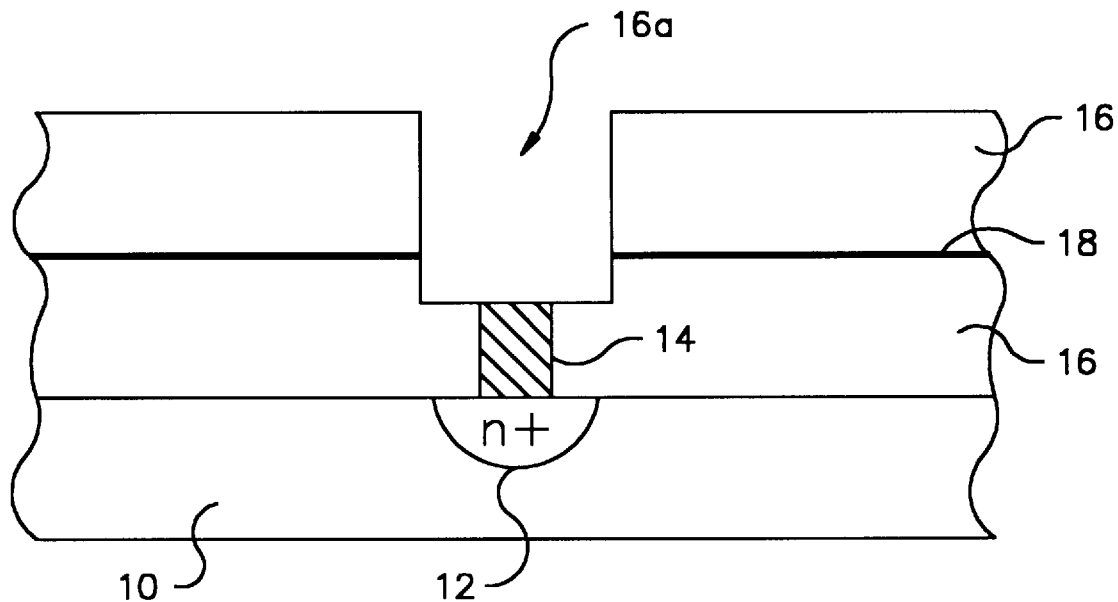
FIG. 1 is a cross-sectional diagram of a structure used for forming a container capacitor having an electrode which is roughened on both its inner and outer surfaces, in accordance with a preferred embodiment of the present invention.

Reference will now be made to the drawings wherein like structures are provided with like reference designations. It will be understood that the drawings included herewith only provide diagrammatic representations of the presently preferred structures of the present invention and that structures falling within the scope of the present invention may include structures different than those shown in the drawings.

Referring now to FIG. 1, there is shown a cross-sectional diagram of a structure used for forming a container capacitor having an electrode which is roughened on both its inner and outer surfaces, in accordance with a preferred embodiment of the present invention. The structure shown in FIG. 1 is formed of a substrate 10 having a doped (n+) region 12 disposed therein. A contact 14, preferably formed of doped silicon, is disposed immediately above region 12. A BPSG layer 16 having a trench 16a is positioned on top of substrate 10. An etch stop layer 18 formed of silicon nitride or TEOS oxide is positioned within BPSG layer 16. The structure shown in FIG. 1 may be formed by methods well known in the art. In a preferred embodiment of the present invention, the thickness of BPSG layer 16 is about 12,000 angstroms, and the thickness of etch stop layer 18 is about 1000 angstroms.

Figure 2:
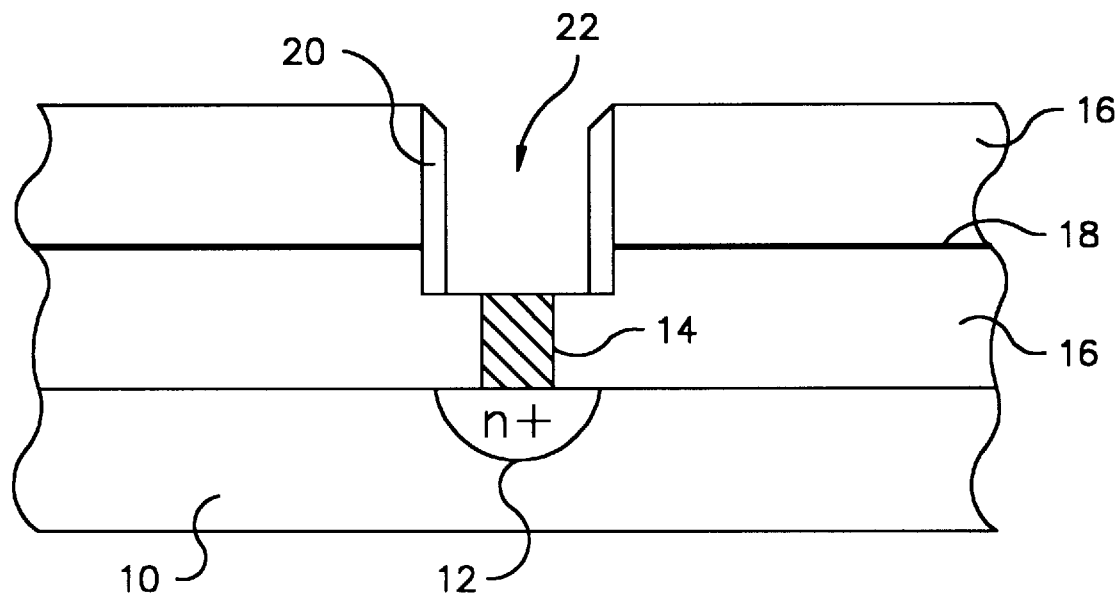
FIG. 2 is a cross-sectional diagram of a structure formed by depositing a layer of GeBPSG on top of the structure shown in FIG. 1 and forming a spacer therein, in accordance with a preferred embodiment of the present invention.

In order to form the container capacitor of the present invention, a layer 20 of GeBPSG (shown in FIG. 2) is deposited on top of BPSG layer 16. The Germanium doped BPSG layer 20 has a dopant concentration above 1%, and, in the preferred embodiment, the dopant concentration in GeBPSG layer 20 is about 10%. Germanium is preferably incorporated in layer 20 in the form of GeO or $GeO_2$ clusters or precipitates. GeBPSG layer 20 is preferably formed on top of BPSG layer 16 using a chemical vapor deposition process ("CVD"), although other procedures may alternatively be used. In the preferred embodiment, GeBPSG layer 20 has a thickness ranging between 200 to 1000 angstroms. Following deposition of GeBPSG layer 20 over top of BPSG layer 16, a space 22 is etched in GeBPSG layer 20, thereby exposing an upper surface of contact 14.

Figure 3:
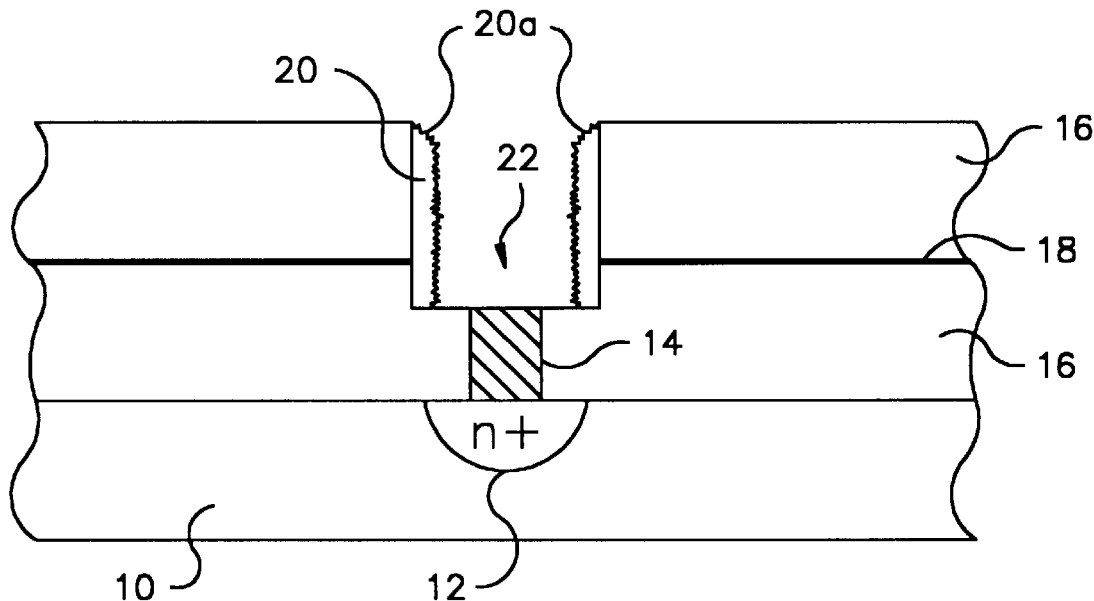
FIG. 3 is a cross-sectional diagram of a structure formed by etching the exposed surface of the GeBPSG layer of the structure shown in FIG. 2, in accordance with a preferred embodiment of the present invention.

Referring now to FIG. 3, following the formation of space 22, a wet etching step is used to roughen surface 20a of GeBPSG layer 20. The wet etching material used in this step may consist of deionized water. Alternatively, a dilute HF solution having a concentration of about 1000:1 may be used for the wet etching step. In a still further alternative embodiment, a dry etching process may be used to form roughened surface 20a on GeBPSG layer 20.

Figure 4:
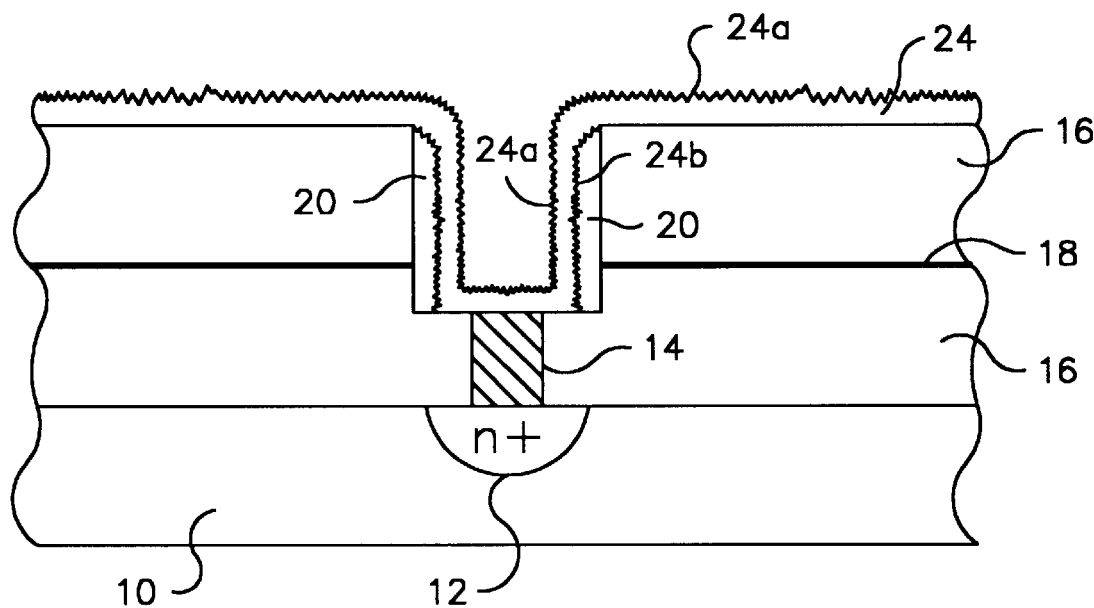
FIG. 4 is a cross-sectional diagram of a structure formed by depositing a roughened layer of polysilicon on top of the structure shown in FIG. 3, in accordance with a preferred embodiment of the present invention.

Referring now to FIG. 4, following the formation of roughened surface 20a, a layer of polysilicon 24 is deposited on top of GeBPSG layer 20. In one embodiment, polysilicon layer 24 is formed of amorphous silicon and is deposited on top of GeBPSG layer using a CVD step, although other procedures may also be used. Polysilicon layer 24 is preferably 250–1000 angstroms in thickness and, still more preferably, 400–600 angstroms in thickness. In a still further preferred embodiment, polysilicon layer 24 will be about 500 angstroms in thickness. When polysilicon layer 24 is formed of amorphous silicon or smooth polysilicon, the inner surface 24a of polysilicon layer 24 will naturally follow the roughened contour of surface 20a, thereby giving inner surface 24a a roughened texture. Outer surface 24b of polysilicon layer 24 will also conform to layer 20a, thereby giving outer surface 24b a roughened texture. In an alternative embodiment, polysilicon having intrinsic surface roughness (shown in FIG. 4) may be used to form layer 24. In this alternative embodiment, after deposition of polysilicon surface 24, polysilicon layer 24 is preferably seeded with a disilane and then annealed in order to form roughened inner surface 24a.

Figure 5:
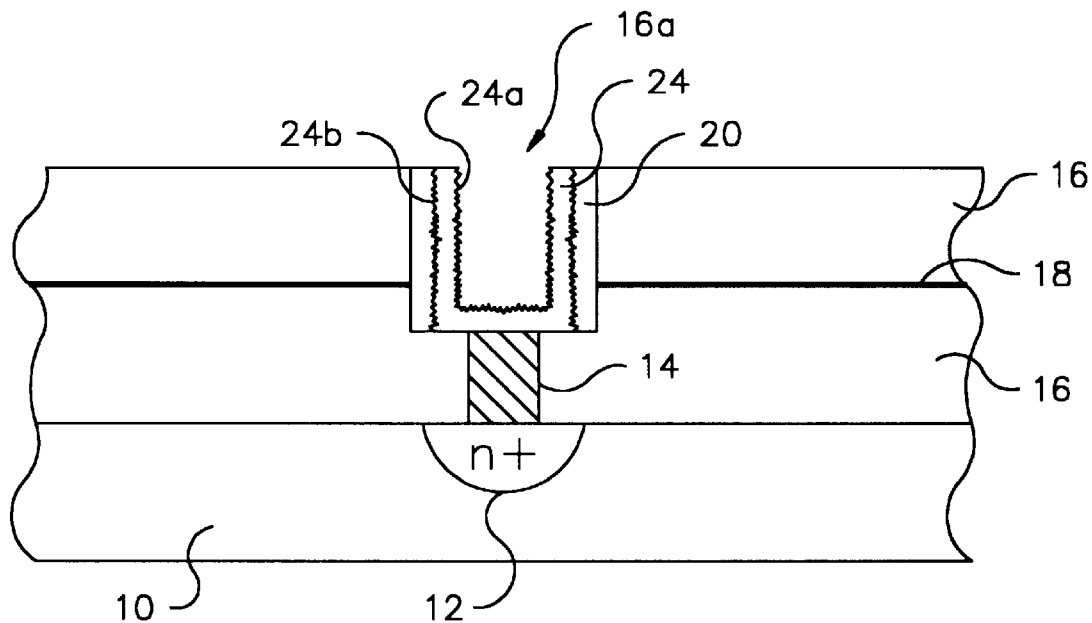
FIG. 5 is a cross-sectional diagram of a structure formed by application of a chemical-mechanical planarization procedure to the structure of FIG. 4, in accordance with a preferred embodiment of the present invention.
Figure 6:
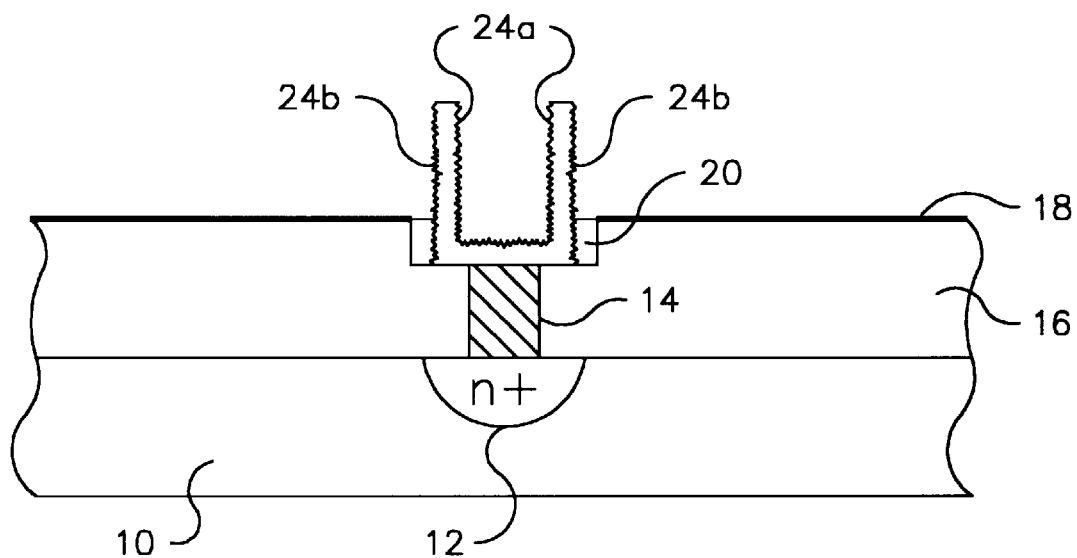
FIG. 6 is a cross-sectional diagram of an improved container capacitor formed by removing portions of the BPSG and GeBPSG layers from the structure shown in FIG. 5, in accordance with a preferred embodiment of the present invention.

Referring now to FIG. 5, after polysilicon layer 24 (having roughened surfaces 24a, 24b) is disposed on top of GeBPSG layer 20, the structure shown in FIG. 4 is subjected to a chemical-mechanical planarization ("CMP") process wherein the portion of polysilicon layer 24 lying outside trench 16 is removed from the structure. Following this CMP step, a wet etch is applied to the BPSG layer 16, thereby etching away the portion of BPSG layer 16 disposed above etch stop 18 and yielding the capacitor electrode structure shown in FIG. 6 having roughened inner surface 24a and roughened outer surface 24b. A dilute HF solution having a concentration of about 100:1 may be used for this wet etching step. In a still further alternative embodiment, a dry etching step may be used to remove the portion of BPSG layer 16 disposed above etch stop 18.

Figure 7:
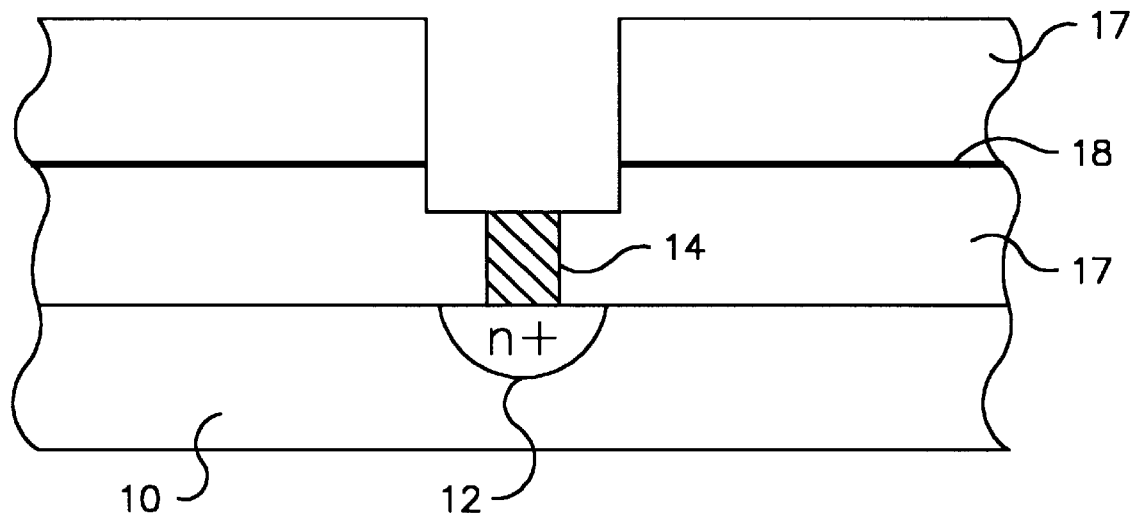
FIG. 7 is a cross-sectional diagram of a structure used for forming a container capacitor having an electrode which is roughened on both its inner and outer surfaces, in accordance with an alternative preferred embodiment of the present invention.

Referring now to FIG. 7, there is shown a cross-sectional diagram of a structure used for forming a container capacitor having an electrode which is roughened on both its inner and outer surfaces, in accordance with an alternative preferred embodiment of the present invention. Like the structure shown in FIG. 1, the structure shown in FIG. 7 is formed of a substrate 10 having a doped (n+) region 12 disposed therein. A contact 14, preferably formed of doped silicon, is disposed immediately above region 12. A template layer 17 formed from, for example, an insulator such as BPSG or GeBPSG, is positioned on top of substrate 10. Since the preferred materials used for forming template layer 17 are BPSG and GeBPSG, template layer 17 will be referred to hereafter as BPSG layer 17, although it will be understood be those skilled in the art that other materials may alternatively be used to form layer 17. An etch stop layer 18 formed of silicon nitride or TEOS oxide is positioned within BPSG layer 17. The structure shown in FIG. 7 may be formed by methods well known in the art. In a preferred embodiment of the present invention where layer 17 is formed of BPSG or GeBPSG, the thickness of BPSG layer 17 is about 12,000 angstroms, and the thickness of etch stop layer 18 is about 1000 angstroms. In a still further embodiment, BPSG layer 17 may be formed of germanium doped BPSG having a dopant concentration above 1%, and, still more preferably, the dopant concentration will be about 10%. Germanium may be incorporated in BPSG layer 17 in the form of GeO or $GeO_2$ clusters or precipitates. BPSG layer 17 is preferably formed on top of substrate 10 using a CVD process, although other procedures may alternatively be used. Although in the preferred embodiment shown in FIG. 7, the portions of layer 17 positioned above and below etch stop layer 18 are formed of the same material, it will be understood by those skilled in the art that the portion of layer 17 disposed above etch stop layer 18 may alternatively be formed of a different material than the portion of layer 17 disposed below etch stop layer 18.

Figure 8:
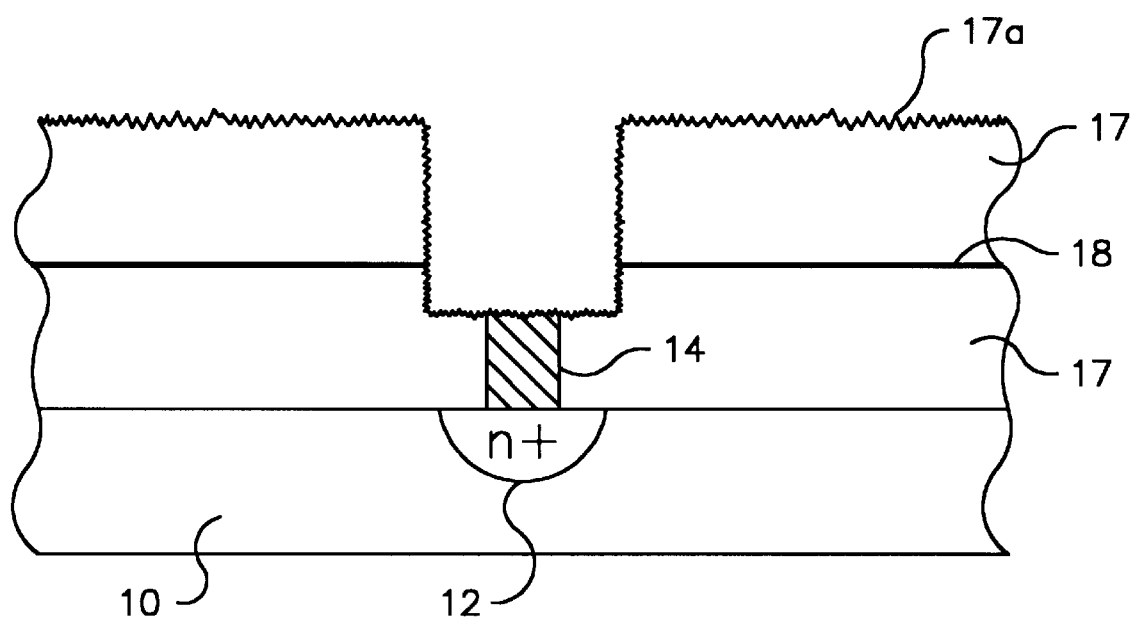
FIG. 8 is a cross-sectional diagram of a structure formed by etching or annealing the BPSG layer of the structure shown in FIG. 7, in accordance with an alternative preferred embodiment of the present invention.

Referring now to FIG. 8, a rapid thermal annealing process is used to roughen surface 17a of BPSG layer 17. In a further alternative embodiment, a sacrificial metal layer or a thin doped polysilicon layer (both not shown) having a higher melting temperature than BPSG layer 17 may be deposited on top of BPSG layer 17 prior to the annealing step to create wrinkled or roughened surface 17a. Alternatively, a wet etching step may be used to roughen surface 17a of BPSG layer 17. The wet etching material used in this step may consist of deionized water. Alternatively, a dilute HF solution having a concentration of about 1000:1 may be used for the wet etching step. In a still further alternative embodiment, a dry etching process may be used to form roughened surface 17a on BPSG layer 17.

Figure 9:
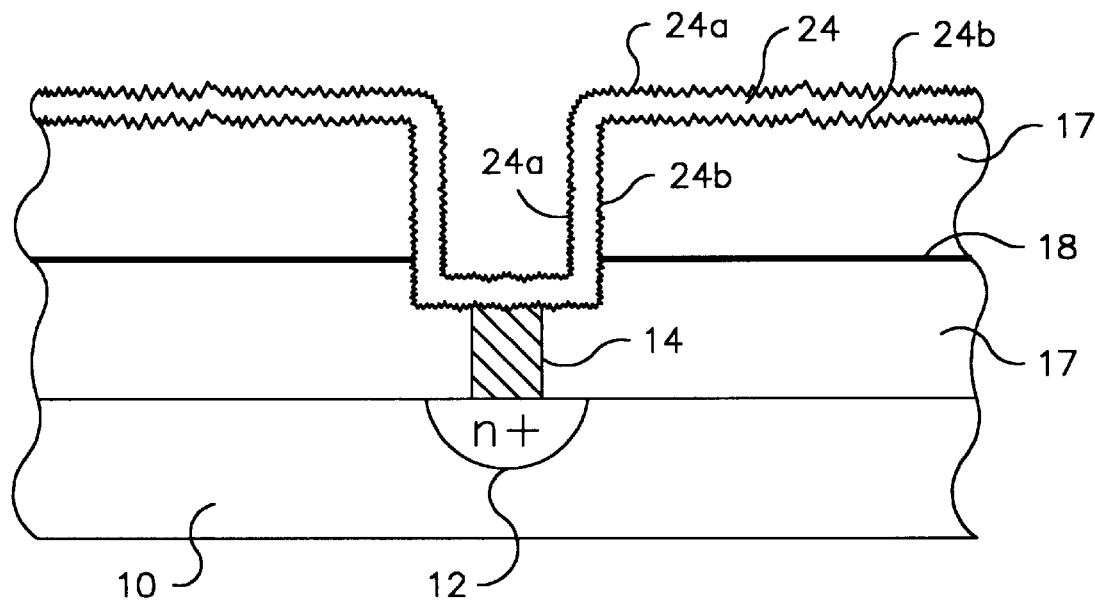
FIG. 9 is a cross-sectional diagram of a structure formed by depositing a layer of polysilicon on top of the roughened BPSG surface of the structure shown in FIG. 8, in accordance with an alternative preferred embodiment of the present invention.

Referring now to FIG. 9, following the formation of roughened surface 17a, a layer of polysilicon 24 is deposited on top of BPSG layer 17. In one embodiment, polysilicon layer 24 is formed of amorphous silicon or smooth polysilicon and is deposited on top of BPSG 17 layer using a CVD step, although other procedures may also be used. Polysilicon layer 24 is preferably 250–1000 angstroms in thickness and, still more preferably, 400–600 angstroms in thickness. In a still further preferred embodiment, polysilicon layer 24 will be about 500 angstroms in thickness. When polysilicon layer 24 is formed of amorphous silicon or smooth polysilicon, the inner surface 24a of polysilicon layer 24 will naturally follow the roughened contour of surface 17a, thereby giving inner surface 24a a roughened texture. Outer surface 24b of polysilicon layer 24 will also conform to layer 17a, thereby giving outer surface 24b a roughened texture. In an alternative embodiment, polysilicon having intrinsic surface roughness may be used to form surface 24. In this alternative embodiment, after deposition of polysilicon layer 24, polysilicon layer 24 is preferably seeded with a disilane and then annealed in order to form roughened inner surface 24a.

Figure 10:
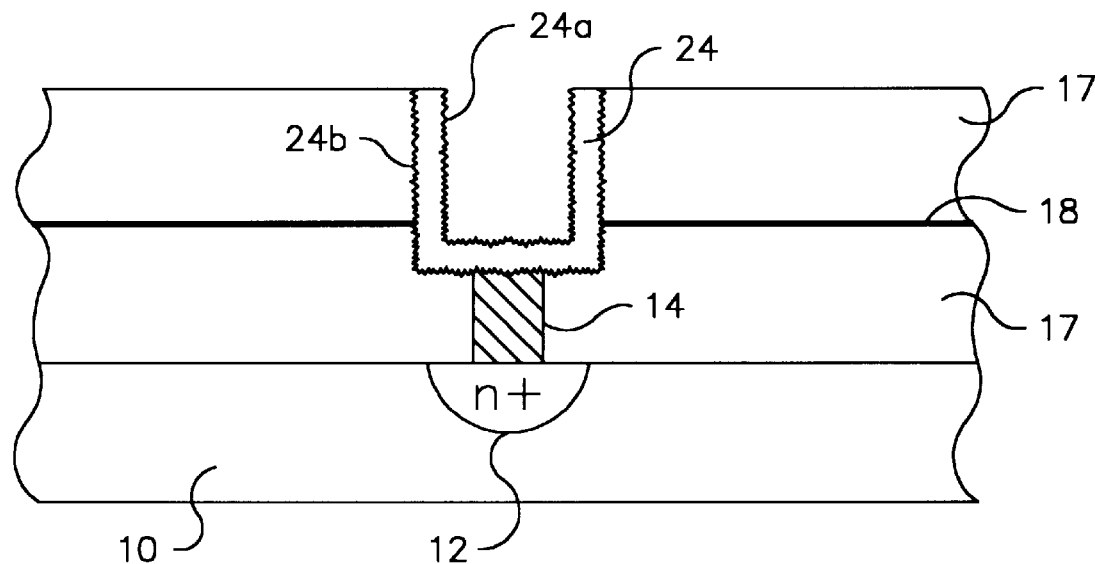
FIG. 10 is a cross-sectional diagram of a structure formed by application of a chemical-mechanical planarization procedure to the structure of FIG. 9, in accordance with an alternative preferred embodiment of the present invention.
Figure 11:
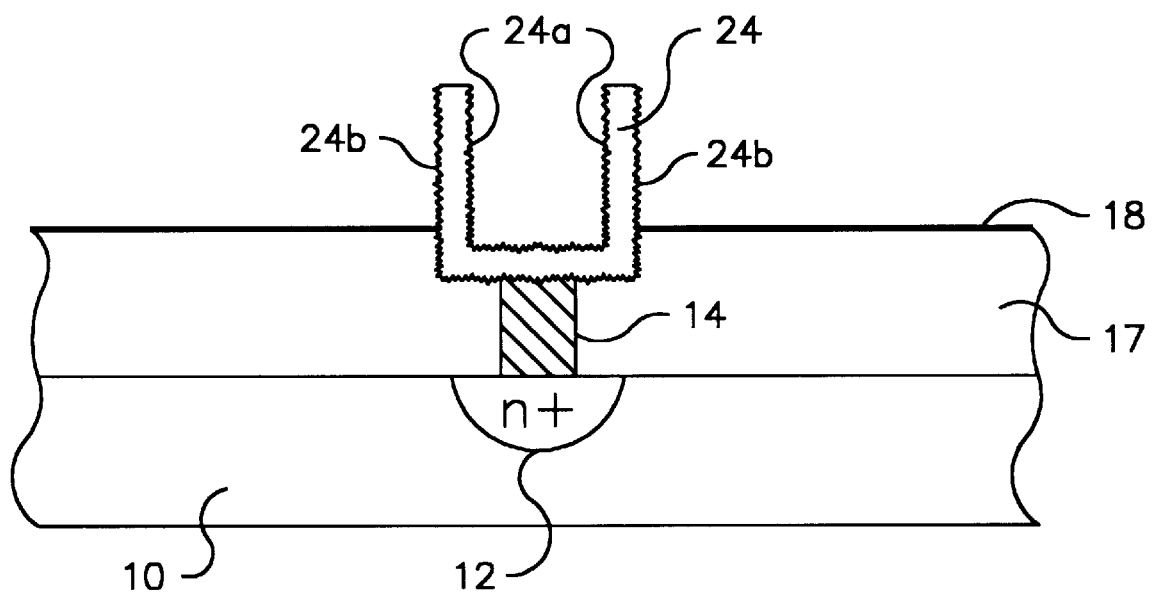
FIG. 11 is a cross-sectional diagram of an improved container capacitor formed by removing a portion of the BPSG layer from the structure shown in FIG. 10, in accordance with an alternative preferred embodiment of the present invention.

Referring now to FIG. 10, after polysilicon layer 24 (having roughened surfaces 24a, 24b) is disposed on top of BPSG layer 17, the structure shown in FIG. 9 is subjected to a CMP process wherein portions of polysilicon layer 24 and BPSG layer 17 are removed from the structure. Following this CMP step, a wet etch is applied to the BPSG layer 17, thereby etching away the portion of BPSG layer 17 disposed above etch stop 18 and yielding the capacitor electrode structure shown in FIG. 11 having roughened inner surface 24a and roughened outer surface 24b. A dilute HF solution having a concentration of about 100:1 may be used for this wet etching step. In a still further alternative embodiment, a dry etching step may be used to remove the portion of BPSG layer 17 disposed above etch stop 18.

Furthermore, it is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A method for forming a polysilicon electrode having at least one roughened surface for use on an integrated circuit, comprising the steps of:
   (A) forming on the surface of a structure a template layer from a BPSG layer;
   (B) after step (A), roughening an exposed surface of said template layer to form a roughened template layer;
   (C) depositing a layer of polysilicon on top of said exposed surface of said roughened template layer; and
   (D) removing at least a portion of said polysilicon layer and at least a portion of said roughened template layer underlying said removed portion of said polysilicon layer to expose at least one roughened surface of said polysilicon electrode, said removal of said at least a portion of said roughened template layer taking place exteriorly of said polysilicon electrode.

2. The method of claim 1, wherein said template layer comprises a doped BPSG layer formed on a BPSG layer, step (B) comprises roughening an exposed surface of said doped BPSG layer to form a roughened doped BPSG layer, and wherein said doped BPSG layer is formed of GeBPSG.

3. The method of claim 2, further comprising the step of forming a space in said doped BPSG layer prior to performing step (B).

4. The method of claim 3, wherein step (B) comprises the step of etching said doped BPSG layer with deionized water or an HF solution.

5. The method of claim 3, wherein step (B) comprises the step of etching said doped BPSG layer with a dry etch.

6. The method of claim 2, wherein step (C) comprises the step of depositing a layer of rough polysilicon on top of said roughened doped BPSG layer.

7. The method of claim 2, wherein a chemical-mechanical planarization process is used in step (D) for removing a portion of said doped BPSG layer.

8. The method of claim 7, wherein step (D) further comprises removing a portion of said BPSG layer with a wet etch.

9. The method of claim 8, wherein said wet etching step comprises etching said BPSG layer down to an etch stop formed between said BPSG layer and said structure.

10. The method of claim 1, wherein said polysilicon layer deposited in step (C) has a thickness of between 400 and 600 angstroms.

11. The method of claim 1, wherein said polysilicon layer deposited in step (C) is formed of amorphous silicon.

12. The method of claim 1, wherein said polysilicon layer deposited in step (C) is formed of smooth polysilicon.

13. The method of claim 1, wherein said electrode is a container capacitor electrode.

14. The method of claim 1, wherein said polysilicon layer deposited in step (C) has a thickness of between 250 and 1000 angstroms.

15. A method of forming a polysilicon electrode having at least one rough surface, comprising the steps of:
   (A) forming on the surface of a structure a template layer from a BPSG layer;
   (B) after step (A), roughening an exposed surface of said template layer to form a roughened template layer;
   (C) depositing a layer of polysilicon on top of said exposed surface of said roughened template layer; and
   (D) removing at least a portion of said roughened template layer to expose at least one roughened surface of said polysilicon electrode, said removal of said at least a portion of said roughened template layer taking place exteriorly of said polysilicon electrode.

16. The method of claim 15, wherein step (B) comprises the step of etching an exposed surface of said BPSG layer with an HF solution to form a roughened BPSG layer.

17. The method of claim 15, wherein step (B) comprises the step of etching an exposed surface of said BPSG layer with a dry etch to form a roughened BPSG layer.

18. The method of claim 16 or 17, wherein said BPSG layer is formed from GeBPSG.

19. The method of claim 15, wherein said polysilicon layer deposited in step (C) is formed of amorphous silicon.

20. The method of claim 15, wherein said polysilicon layer deposited in step (C) is formed of smooth polysilicon.

21. The method of claim 15, wherein said polysilicon layer deposited in step (C) is formed of a layer of rough polysilicon.

22. The method of claim 15, wherein said polysilicon electrode formed by said method has roughened inner and outer surfaces.

23. The method of claim 15, wherein said polysilicon layer deposited in step (C) has a thickness of between 250 and 1000 angstroms.

* * * * *